US006995312B2

(12) United States Patent
Zhou et al.

(10) Patent No.: US 6,995,312 B2
(45) Date of Patent: Feb. 7, 2006

(54) BISTABLE MOLECULAR SWITCHES AND ASSOCIATED METHODS

(75) Inventors: Zhang-Lin Zhou, Mountain View, CA (US); Sean Xiao-An Zhang, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 135 days.

(21) Appl. No.: 10/786,986

(22) Filed: Feb. 24, 2004

(65) Prior Publication Data

US 2004/0165806 A1 Aug. 26, 2004

Related U.S. Application Data

(63) Continuation-in-part of application No. 10/013,643, filed on Nov. 13, 2001, now Pat. No. 6,751,365, and a continuation-in-part of application No. 09/898,799, filed on Jul. 3, 2001, and a continuation-in-part of application No. 09/823,195, filed on Mar. 29, 2001.

(51) Int. Cl.
*C09K 9/02* (2006.01)

(52) U.S. Cl. ...................................... 136/263; 136/252

(58) Field of Classification Search ................ 136/263, 136/252, 256

See application file for complete search history.

(56) References Cited

U.S. PATENT DOCUMENTS

| | | | | |
|---|---|---|---|---|
| 6,031,756 | A * | 2/2000 | Gimzewski et al. | 365/151 |
| 6,072,716 | A | 6/2000 | Jacobson et al. | |
| 6,128,214 | A | 10/2000 | Kuekes et al. | |
| 6,320,200 | B1 | 11/2001 | Reed et al. | |
| 6,433,270 | B1 * | 8/2002 | Rack | 136/263 |
| 6,512,119 | B2 | 1/2003 | Bratkovski et al. | |
| 6,541,309 | B2 | 4/2003 | Chen | |
| 6,542,400 | B2 | 4/2003 | Chen et al. | |
| 6,624,002 | B2 | 9/2003 | Bratkovski et al. | |
| 6,656,763 | B1 | 12/2003 | Oglesby et al. | |
| 2002/0075557 | A1 | 6/2002 | Zhang et al. | |
| 2002/0114557 | A1 | 8/2002 | Zhang et al. | |
| 2002/0176276 | A1 | 11/2002 | Zhang et al. | |
| 2003/0012484 | A1 | 1/2003 | Zhang et al. | |

OTHER PUBLICATIONS

Collier, Charles P., Gunter Mattersteig, Eric W. Wong, Yi Luo, Kristen Beverly, Jose Sampaio, Francisco M. Raymo, J. Fraser Stoddart and James R. Heath, “A [2]Catenane-Based Solid State Electronically Reconfigurable Switch,” SCIENCE, vol. 289, Aug. 18, 2000, pp. 1172-1175.

Eaborn, C. and D.R.M. Walton, “Organogermanium compounds: VI. The preparation of some substituted (phenylethynyl)-trialkyl-germanes and -silanes,” J. Organometal. Chem., 2, (1964), pp. 95-97.

Earborn, C., A.R. Thompson and D.R.M. Walton, “The Protection of Terminal Ethynyl Groups in Grignard Syntheses,” J. Chem. Soc. (C., 1967), pp. 1364-1366.

Collier, C.P., E.W. Wong, M. Belohradsky, F.M. Raymo, J.F. Stoddart, P.J. Kuekes, R.S. Williams, and J.R. Heath, “Electronically Configurable Molecular-Based Logic Gates, ” SCIENCE, vol. 285, Jul. 16, 1999, pp. 391-394.

* cited by examiner

*Primary Examiner*—Hung Xuan Dang

(57) ABSTRACT

A bistable molecular switch can have a highly conjugated first state and a less conjugated second state. The bistable molecular switch can be configured such that application of an electric field reversibly switches the molecular switch from the first state to the second state. Additionally, the bistable molecular switch can include a hydrophobic moiety and a hydrophilic moiety. Such molecular switches can be incorporated into a thin film as part of a molecular switch system which can include a layer of molecular switches between a first electrode layer and a second electrode layer. The layer of molecular switches can have substantially all of the molecular switches having their hydrophilic moiety oriented in the same direction. An electric potential can then be induced between the first and second electrode layers sufficient to switch the molecular switches from the first or second state to the second or first state, respectively. The first and second states have differences in resistivity which are suitable for use in electronic applications. Thin films containing these oriented molecular switches can be used to produce a wide variety of electronic components such as ROM memory and the like.

36 Claims, No Drawings

BISTABLE MOLECULAR SWITCHES AND ASSOCIATED METHODS

CLAIM OF PRIORITY

The present application is a continuation-in-part application of U.S. patent application Ser. No. 10/013,643, filed Nov. 13, 2001 now U.S. Pat. No. 6,751,365; and of U.S. patent application Ser. No. 09/898,799, filed Jul. 3, 2001; and of U.S. patent application Ser. No. 09/823,195, filed Mar. 29, 2001, which are each incorporated by reference in their respective entireties.

FIELD OF THE INVENTION

The present invention relates generally to molecular electronic switches. More particularly, the present invention relates to specific classes of compounds which are bistable and suitable for production of electronic devices such as ROM memory and the like.

BACKGROUND OF THE INVENTION

Increases in computer speeds and concurrent increases in demand for space and decreased component sizes continue to challenge the electronics industry. Recent interest and effort has grown in the area of molecular electronics as a potential solution to at least some of these problems. Only a small handful of research groups have produced molecules which act as molecular switches. Most of these molecular switches have features that limit their practical use. Initial demonstrations of molecular switches used rotaxanes or catenanes which were trapped between two electrodes. The molecular switches were switched from an ON state to an OFF state by application of a positive bias across the molecule. The ON and OFF states differed in resistance by a factor of 100 for rotaxane and a factor of 5 for catenane.

Unfortunately, rotaxanes provide an irreversible switch that can only be toggled once. Thus, it can be suitable for use in a programmable read-only memory (PROM) device; however, it is unsuitable for use in reconfigurable devices. Further, rotaxanes are complex molecules which tend to be relatively large. As a result, the switching times of these molecules can be slow. In addition, rotaxanes require an oxidation and/or reduction reaction to occur before the switch can be toggled. With respect to catenane switches, the primary concerns are the small ON-to-OFF ratio and slow switching times.

Therefore, materials and methods which allow for reversible switching and decreased switching times suitable for commercial devices continue to be sought through research and development.

SUMMARY OF THE INVENTION

It would be advantageous to develop improved methods and materials which can be used to produce reversible molecular switches. In one aspect of the present invention, a bistable molecular switch can have a highly conjugated first state and a less conjugated second state. The bistable molecular switch can be configured such that application of an electric field reversibly switches the molecular switch from the first state to the second state. Additionally, the bistable molecular switch can include a hydrophobic moiety and a hydrophilic moiety.

In another aspect of the present invention, the molecular switches can be used in a method for storing data. A molecular switch system can be formed which can include a layer of molecular switches between a first electrode layer and a second electrode layer. The layer of molecular switches can have substantially all of the molecular switches having their hydrophilic moiety oriented in the same direction. An electric potential can then be induced between the first and second electrode layers sufficient to switch the molecular switches from the first or second state to the second or first state, respectively.

Additional features and advantages of the invention will be apparent from the following detailed description, which illustrates, by way of example, features of the invention.

DETAILED DESCRIPTION OF THE PREFERRED EMBODIMENT(S)

Reference will now be made to exemplary embodiments and specific language will be used herein to describe the same. It will nevertheless be understood that no limitation of the scope of the invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a rotor" includes reference to one or more of such structures.

As used herein, "bistable" refers to a property of a molecule such that the molecule has at least two relatively low energy states separated by an activation barrier. The molecule can be independently stable in either of the two low energy states.

As used herein, "reversibly" refers to a process of change in condition which is not permanent and can be undone to return to an original condition. For example, reversibly switching a molecule can involve changing a molecular configuration from a first state to a second state. The molecule can subsequently be reversibly switched from the second state to the original first state.

As used herein, "conjugated" refers to the degree of $\pi$-bonding electrons in a molecule. A highly conjugated molecule has a relatively high number of electrons occupying $\pi$ bonds. Such conjugated molecules are also characterized by a delocalization of electrons over at least a portion of the molecule.

As used herein, "monolayer" refers to a layer of molecules which has a thickness of a single molecule. A monolayer can cover almost any area and has a thickness of one molecule substantially over the entire area. Those skilled in the art will recognize that a small number of defects can be present in such monolayers and such defects are acceptable, as long as the desired properties are maintained.

As used herein, "self-assembly" refers to a process wherein a system, i.e. plurality of molecules, naturally adopts a regular pattern and orientation of individual molecules based on the conditions and molecules involved.

As used herein, "substituted" refers to a compound having a carbon and/or hydrogen replaced by a heteroatom or functional group.

As used herein, "dipole moment" refers to any charge separation which is associated with uneven electron distributions within a molecule or portion thereof and can be described by a vector. The term should also be interpreted to cover multipole moments, e.g., quadrupoles, octopoles, etc.

As used herein, "$\pi$-bonding electrons" refers to electrons which occupy orbitals associated with $\pi$ bonds, whether pure $\pi$ bonds or hybridized bonds, e.g., $\sigma$-$\pi$ bonds.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 $\mu$m to about 200 $\mu$m should be interpreted to include not only the explicitly recited limits of 1 $\mu$m and about 200 $\mu$m, but also to include individual sizes such as 2 $\mu$m, 3 $\mu$m, 4 $\mu$m, and sub-ranges such as 10 $\mu$m to 50 $\mu$m, 20 $\mu$m to 100 $\mu$m, etc.

In accordance with the present invention, a bistable molecular switch can have a highly conjugated first state and a less conjugated second state. In the highly conjugated first state, the molecular switch is typically conductive, while in the less conjugated second state the molecular switch is less conductive. Application of an electric field can reversibly switch the molecular switch from the first state to the second state or from the second state to the first state, depending on the direction of the applied electric field. Molecular switches of the present invention can typically include a hydrophobic moiety and a hydrophilic moiety.

A number of mechanisms can be utilized to accomplish reversible switching of molecules. In one embodiment, reversible switching can be accomplished using electric field induced rotation of a portion of the molecular switch sufficient to change the band gap, i.e. conductivity, of the molecular switch. In another embodiment, reversible switching can be realized using electric field induced rearrangement of bonding sufficient to cause a change in band gap. In this embodiment, intramolecular bonds can be formed and/or broken which allow for a reversible change in the conjugation of the molecule. In yet another embodiment, reversible switching can be achieved using electric field induced intramolecular folding and/or stretching.

Molecular Switches

In accordance with the present invention, electric field induced rotation of a portion of the molecular switch can be a highly effective mechanism for reversible switching. Specifically, the molecular switch can include at least one rotor, which is a portion of the molecular switch that can rotate or otherwise change position with respect to the balance of the molecular switch molecule. Each rotor can have a donor group and an acceptor group, each of which is operably connected thereto. Typically, the rotor can be connected to at least one stator and preferably between two stators such that rotation of the rotor is permitted with respect to the stators. Stators are typically relatively stationary moieties that can contribute to providing an axis for the rotor to rotate or change position. In one embodiment of a rotor-stator-type mechanism, the molecular switches of the present invention can have the general molecular structure of Formula I, as follows:

$$X_1 - Y_1 - Z_1 - \underset{\displaystyle A}{\underset{|}{\overset{\displaystyle D}{\overset{|}{R}}}} - Z_2 - Y_2 - X_2 \qquad \text{(I)}$$

where A is an acceptor group, D is a donor group, R is a rotor, $X_1$ is a hydrophilic moiety, $X_2$ is a hydrophobic moiety, $Y_1$ is a first stator, $Y_2$ is a second stator, $Z_1$ is a first bridging group, and $Z_2$ is a second bridging group. Additional optional groups can also be included between the bridging groups and stators, and/or the rotor, hydrophilic moiety, and hydrophobic moiety. Alternatively, some of these components can be merged into single components, such as where a bridging group is part of one of the stators or the rotor, for example. Each of the groups described in Formula I above is discussed in more detail below.

Suitable rotor groups can have a variety of configurations. However, as a general guideline, rotors can be planar groups having at least some electrons available for $\pi$-bonding orbitals. In one embodiment, a rotor can be aromatic or heterocyclic. For example, suitable rotors can include, without limitation, benzene or substituted benzene, naphthalene, acenaphthalene, anthracene, phenanthrene, benzanthracene, dibenzanthracene, fluorene, benzofluorene, fluoranthene, pyrene, benzopyrene, naphthopyrene, chrysene, perylene, benzoperylene, pentacene, coronene, tetraphenylene, triphenylene, decacyclene, pyrrole, thiophene, porphine, pyrazole, imidazole, triazole, isoxazole, oxadiazole, thiazole, isothiazole, thiadiazole, pyridazine, pyrimidine, uracil, azauracil, pyrazine, triazine, pyridine, indole, carbazole, benzofuran, dibenzofuran, thianaphthene, dibenzothiophene, indazole, azaindole, iminostilbene, norharman, benzimidazole, benzotriazole, benzisoxazole, anthranil, benzoxazole, benzothiazole, triazolopyrimidine, triazolopyridine, benzselenazole, purine, quinoline, benzoquinoline, acridine, iso quinoline, benzacridine, phenathridine, phenanthroline, phenazine, quinoxaline, and combinations thereof. Specific non-limiting examples of suitable rotors include phenyl, biphenyl, benzyl, or the like. In one embodiment, the rotor can include phenyl.

In accordance with embodiments of the present invention, the rotor can have at least one acceptor group and at least one donor group connected such that the A-R-D portion of Formula I has a relatively large dipole moment. Under an applied electric field, the A-R-D portion of the molecular switch can rotate in an attempt to align the dipole moment parallel with the electric field. The magnitude of the dipole moment can be largely determined by the relative difference in electronegativity of the acceptor and donor groups. Thus, the donor group can have a lower electronegativity than the acceptor group in order to produce an A-R-D rotor segment having a relatively large dipole moment.

The acceptor and donor groups can be operably connected to the rotor in any number of configurations. Any functional configuration can be used, as long as the A-R-D rotor segment has a large dipole moment. In one embodiment, the acceptor and donor groups can be attached to the rotor directly opposite each other. For example, Formula II shows a molecular switch having a phenyl rotor with the acceptor and donor groups that are positioned para, as shown below:

(II)

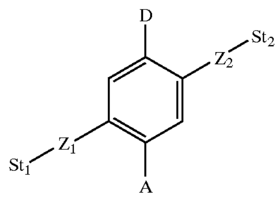

where $St_1$ and $St_2$ represent the stators in combination with the hydrophilic and hydrophobic moieties, respectively, and $Z_1$, $Z_2$, A, and D are defined as described in Formula I. In Formula II, the electric field can be applied substantially perpendicular to a molecular axis defined along a line between $St_1$ and $St_2$. In some embodiments, the electric field can be applied from about a 45° to about a 90° angle with respect to the molecular axis. Therefore, the dipole moment and electric field can be offset in some embodiments. Alternatively, the acceptor and donor groups can be attached at various positions on the rotor. For example, the acceptor and donor groups can be attached to a phenyl rotor such that the groups are positioned meta with respect to one another. In short, almost any configuration where the dipole moment can cause motion of the rotor under the applied electric field can be operable.

Application of an electric field would tend to flip an unhindered rotor an entire 180°. Such a full 180° rotation would leave the overall conjugation of the molecular switch substantially unchanged with respect to functioning as an electrical switch. Therefore, in some embodiments, steric or Coulombic repulsion can prevent the rotor from rotating a full 180°. Thus, in a first highly conjugated state, the rotor and stators, along with any other portions of the molecular switch have electrons delocalized, or shared, over a large portion of the molecular switch. This first state is typically associated with rotor and stators in a coplanar orientation. Conversely, in the second less conjugated state, the rotor is not coplanar with the stators. As a result, conjugation is segregated to various portions of the molecular switch. Typically, the π-bonding electrons are segregated separately in the rotor and each stator in the second state.

As further guidance in forming suitable A-R-D rotor portions of the molecular switches of the present invention, the donor group can be any group which is electron donating in a given environment. Several non-limiting examples of suitable donor groups include a hydrocarbon having from one to six carbon atoms, hydrogen, amine, hydroxy, thiol, ether, and combinations thereof. Further, the donor group can be a functional group containing at least one heteroatom selected from the group consisting of B, Si, I, N, O, S, and P. In one embodiment, the donor group can be methyl.

Similarly, the acceptor group can be any group which is electron withdrawing in the given environment. Suitable acceptor groups can include, but are not limited to, nitro, nitrile, hydrogen, acids, ketone, imine, trifluoromethyl, trichloromethyl, hydrocarbons having from one to six carbon atoms, and combinations thereof. Additionally, the acceptor group can be heteroatoms selected from the group consisting of N, O, S, P, F, Cl, and Br, or functional groups having at least one of such heteroatoms, e.g., OH, SH, NH, and the like. In one specific embodiment, the acceptor group can be nitro.

The above listed donor and acceptor groups are merely exemplary and those skilled in the art can choose other appropriate groups based on the description herein. Further, the specific donor and acceptor groups are not as important as the relative differences in electronegativity. This is why several groups listed can be either a donor or acceptor group depending on the other group attached to the rotor. One basic consideration in choosing appropriate donor and acceptor groups is that the donor group has a lower electronegativity than the acceptor group sufficient to create a large dipole moment across the rotor. In some embodiments of the present invention, the large dipole moment can be from about 3 Debye (D) to about 30 D, and can typically range from about 4 D to about 6 D.

In order to facilitate rotation of the rotor, bridging groups can be connected between the rotor and stators, as shown in Formula I. Suitable bridging groups can have at least one bond about which rotation can occur. Additionally, bridging groups having available π-bonding electrons can further increase the overall conjugation of the molecular switch. In one aspect, the bridging groups can be acetylene, ethylene, amide, imide, imine, azo, and combinations thereof. In one specific embodiment, the bridging groups can each be acetylene. Alternatively, as described previously, bridging groups can be part of or provided by either the rotor or stators.

The stators can be of any group which is configured to substantially maintain its position relative to the rotor during rotation of the rotor. Suitable stators can include conjugated rings, aromatic rings, and saturated, unsaturated, or substituted hydrocarbons. Typically, stators can include rings which have π-bonding electrons available to contribute to the overall conjugation of the molecular switch. In one aspect of the present invention, stators can be independently selected from groups such as benzene or substituted benzene, phenyl, naphthalene, acenaphthalene, anthracene, phenanthrene, benzanthracene, dibenzanthracene, fluorene, benzofluorene, fluoranthene, pyrene, benzopyrene, naphthopyrene, chrysene, perylene, benzoperylene, pentacene, coronene, tetraphenylene, triphenylene, decacyclene, pyrrole, thiophene, porphine, pyrazole, imidazole, triazole, isoxazole, oxadiazole, thiazole, isothiazole, thiadiazole, pyridazine, pyrimidine, uracil, azauracil, pyrazine, triazine, pyridine, indole, carbazole, benzofuran, dibenzofuran, thianaphthene, dibenzothiophene, indazole, azaindole, iminostilbene, norharman, benzimidazole, benzotriazole, benzisoxazole, anthranil, benzoxazole, benzothiazole, triazolopyrimidine, triazolopyridine, benzselenazole, purine, quinoline, benzoquinoline, acridine, isoquinoline, benzacridine, phenathridine, phenanthroline, phenazine, quinoxaline, derivatives of these groups, and combinations thereof. Stators which comprise phenyl have proven particularly useful in constructing molecular switches in accordance with the present invention.

One specific sub-class of molecular switches which can be used, has the general chemical structure shown in Formula III, as follows:

(III)

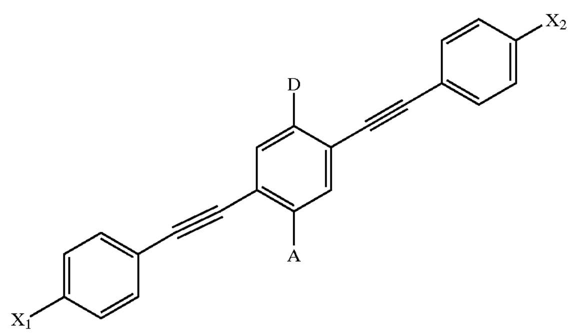

where the bridging groups are each acetylene and the stators are each phenyl. $X_1$, $X_2$, A, and D are defined as described in Formula I One difficulty with molecular switches can be related to the orientation of individual molecules in a useful direction with respect to an electric field and/or associated electrodes.

In accordance with one aspect of the present invention, hydrophobic and hydrophilic groups can be attached at either end of the molecular switch. Forming molecular switches each having a hydrophilic and a hydrophobic moiety allows for arrangement of individual molecules using thin film techniques such as self-assembly techniques, Langmuir-Blodgett techniques, and the like.

The hydrophobic moiety suitable for use in the molecular switches can include any functional hydrophobic group. Suitable hydrophobic moieties can include long substituted or unsubstituted hydrophobic chains having from 6 to about 30 carbons. In a detailed aspect, the hydrophobic moiety can be a long substituted or unsubstituted hydrophobic chain having from 8 to about 20 carbons. Specific non-limiting examples of hydrophobic moieties for use with the present invention include alkyl, alkoxy, alkyl thio, alkyl seleno, alkyl amino, aryl, aryloxy, aryl thio, aryl seleno, aryl amino, and the like. In one embodiment, the hydrophobic moiety can be an unsubstituted alkyl. Further, the molecular switches of the present invention can have a plurality of hydrophobic moieties. In some embodiments, the hydrophobic moiety can be selected to create a protective layer between the rotor and an electrode. This protective layer can provide chemical and mechanical protection to the stator and rotor portions of the molecular switches. This can be particularly helpful during construction of an operable molecular switch system, described in more detail below. Such construction often involves processes such as metal deposition, which may damage unprotected stators and/or rotors. Hydrophobic moieties which provide such protection can typically form a protective layer from about 1 nm to about 4 nm in thickness.

Any functional hydrophilic moiety can be used in the molecular switches of the present invention. The hydrophilic moiety can be selected to form a bond, e.g., chemical, mechanical, or electrostatic, between the switchable molecule and a substrate, such as an electrode. Hydrophilic moieties can typically form a protective layer from about 0.1 nm to about 1.5 nm in thickness. Several non-limiting examples of suitable classes of hydrophilic moieties include carboxylic acids, alcohols, amines, thiols, sulfonic acids, sulfuric acid, ethyl, ethers or polyethers, tetrahydrofurans, pyridines, imidazoles, pyrroles, furans, thiophenes, and the like. In one specific embodiment, the hydrophilic moiety can be carboxylate. Additionally, the molecular switches of the present invention can have a plurality of hydrophilic moieties.

Formula IV depicts one currently useful class of molecular switches in accordance with the principles of the present invention, as shown below:

(IV)

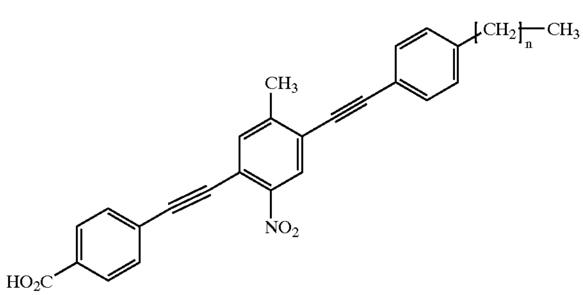

where n is an integer from 5 to about 29. In accordance with an alternative embodiment of the present invention, the hydrophilic and/or hydrophobic moieties can be supplied as part of the stators. For example, phenyl can act as both a stator and a hydrophobic moiety.

Film of Molecular Switches

In accordance with an additional aspect of the present invention, the molecular switches can be assembled to form a molecular switch system. The molecular switch system can include a substrate and a plurality of bistable molecular switches on the substrate. The molecular switch system preferably has substantially all of the molecular switches oriented such that the hydrophilic moieties are oriented in the same direction.

There are a number of methods by which the molecular switches can be arranged having their hydrophilic moieties oriented in the same direction. Typically, suitable thin film preparation methods can include, without limitation, Langmuir-Blodgett (L-B), self-assembly mechanisms (SAM), vapor phase deposition, or the like. Alternatively, the molecular switches can be suspended in a solvent based solution which is then thick film coated onto a substrate, e.g., reverse rolling, spin-coated onto a substrate, or dried while being subjected to an electric field that orients the molecules. In one embodiment, the thin film method used can allow formation of a monolayer of molecular switches. Essentially, any method that can produce a substantially monolayer thin film where a molecular axis is defined by an axis between the hydrophobic and hydrophilic moieties, and is oriented substantially parallel with the electric field that will be applied, can be suitable for use in the present invention. Typical L-B film methods and self-assembly methods can provide a very high concentration of molecular switches per area. For example, in some embodiments of the present invention, the molecular switches can be formed in a monolayer at concentrations of about $10^6$ molecules per square micron to about $10^7$ molecules per square micron.

In one aspect, the molecular switches can be arranged using a SAM technique. In an alternative aspect, the molecular switches can be arranged using Langmuir-Blodgett (L-B) films. L-B film techniques are well known to those skilled in the art. Typically, L-B methods involve placing a measured amount of material having hydrophobic groups and hydrophilic groups on a fluid surface. The material forms a monolayer at the surface with the hydrophilic groups oriented in the same direction. The fluid can typically be water; however, other materials can be used, e.g., glycerine, mercury, etc. If water is used, then the hydrophilic ends are oriented in the water, while the hydrophobic ends are oriented away from the water surface. Alternatively, a hydrophobic material can be used such that the hydrophobic end is oriented toward the hydrophobic material and the hydrophilic end is oriented away from the hydrophobic material.

After configuring the hydrophobic end and the hydrophilic end as described previously, a first substrate can then be passed through the monolayer, wherein the molecules transfer to the substrate as a monolayer. The substrate can have either a hydrophilic or hydrophobic surface. Typically, hydrophilic substrates can be passed through the monolayer from the water side, while hydrophobic substrates can typically be passed through the monolayer from above the monolayer. Passing a hydrophilic substrate through the monolayer can result in the molecular switches oriented with the hydrophilic ends toward the substrate and the hydrophobic ends oriented away from the substrate. Similarly, passing a hydrophobic substrate through the monolayer results in the hydrophilic ends oriented away from the substrate.

The molecular switch systems of the present invention can include forming either a single monolayer of molecular switches or a plurality of monolayers. The L-B method is well suited for the formation of either a single monolayer or multiple stacked monolayers. When multiple monolayers are formed, the hydrophilic ends of the molecular switches can substantially all become oriented in a common same direction. The first substrate having a monolayer thereon can be passed through an L-B film to deposit additional monolayers on the surface. Multiple passes of a hydrophilic substrate can be referred to as Z-type deposition, whereas multiple passes of a hydrophobic substrate can be referred to as Y-type deposition.

Suitable hydrophilic substrates can include, without limitation, silver, gold, copper, chromium, aluminum, tin, tin oxides, glass, quartz, silicon, gallium arsenide, and alloys thereof. In one aspect, the first substrate can be formed of a conductive metal such as silver, gold, copper, or the like. Suitable hydrophobic substrates can include, without limitation, etched silicon, mica, highly ordered pyrolytic graphite (HOPG), or the like. Most often, the substrates of the present invention can be hydrophilic substrates. In one aspect, the first substrate can be a conductive layer suitable for use as an electrode. Alternatively, the substrate can comprise a transparent or translucent material. Such transparent materials can be suitable for use in producing heads-up displays or other see-through devices.

In accordance with the present invention, the molecular switch system can further include a second substrate opposite the first substrate such that the plurality of molecular switches are between the first and second substrates. The second substrate can be formed using any number of known deposition techniques. Several non-limiting examples of suitable deposition techniques include physical vapor deposition, electrodeposition, electroless deposition, and the like.

The second substrate can be formed of a variety of materials, depending on the desired application. The second substrate can be formed of the same or of a different material than the first substrate. Non-limiting examples of suitable substrate materials include metals, metal oxides, metal alloys, glass, quartz, mica, HOPG, or the like. In one detailed aspect, the second substrate can be formed of silver, gold, copper, platinum, chromium, aluminum, glass, quartz, silicon, gallium arsenide, ITO, or alloys thereof. Further, the second substrate can typically be a conductive electrode layer comprising a conductive metal or alloy such as silver, gold, copper, alloys thereof, or the like.

The first and second substrates can be almost any practical thickness, depending on the intended application. Typically, the molecular switch system of the present invention can include substrates having a thickness of from 1 nm to about 1.5 μm, though thickness up to 500 μm can be used. Similarly, the specific molecular switches used can affect the total thickness of the molecular switch system. The layer of molecular switches can have a thickness of from about 1 nm to about 100 nm, depending on the number of monolayers and the specific molecular switch structure. In embodiments having a single monolayer of molecular switches, the layer of molecular switches can have a thickness of from about 1 nm to about 10 nm. In one aspect, the layer of molecular switches can have a thickness of from about 1.5 nm to about 5 nm. In one detailed embodiment of the present invention, the entire molecular switch system can have a thickness of from about 1 nm to about 100 mm.

The layer of molecular switches can cover an entire substrate surface or merely a portion thereof, depending on the intended application. For example, it can be desirable to deposit molecular switches over a portion of a substrate in order to leave room for additional components formed by subsequent processing, such as by photolithographic exposure or the like. The layer of molecular switches can cover an area of the substrate of from about 0.01 $\mu m^2$ to about 0.01 $mm^2$, although areas outside this range can be used, depending on the application. For example, areas up to 1 $cm^2$ and beyond are possible. Those skilled in the art can design specific electronic structures and devices based on the disclosure herein to thus incorporate the molecular switches of the present invention into a variety of devices.

The molecular switch systems of the present invention can be used for a variety of applications. Among these applications include methods of storing data. A molecular switch system, including a layer of molecular switches between a first electrode layer and a second electrode layer, can be formed as discussed above. With substantially all of the hydrophilic moieties oriented in the same direction, application of an electric potential across the electrode layers can have a relatively uniform effect on individual molecular switches. Typically, inducing an electric potential between the first and second electrode layers can be sufficient to switch the molecular switches from the first or second state to the second or first state, respectively. Recall that the first state is the highly conjugated state, while the second state is less conjugated. Formula V illustrates an exemplary situation with respect to a single molecular switch within a monolayer, as follows:

(V)

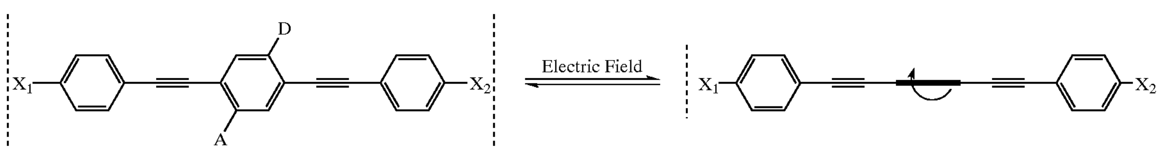

First State

Second State

The dashed lines represent the electrode layers, and $X_1$, $X_2$, A, and D are defined as described in Formula I. Formula V shows the rotor having rotated 90°; however, this is merely an idealized rotation shown for exemplary purposes, as actual angles of rotation can vary somewhat as discussed earlier. The actual angle of rotation can depend on the specific acceptor and donor groups, associated steric interactions, i.e. including intermolecular and intramolecular forces, applied electric field strength, temperature, and the like. More generally, for the molecular switch of Formula V, the angle of rotation can vary from about 30° to about 150°.

In addition, the rotation of the rotor is typically not acting alone without other outside influences. Specifically, the single bistable molecule shown in Formula V is part of a large number of molecular switches that form a monolayer. Other similar bistable monolayers are oriented generally parallel with respect to the depicted single molecule to form a plane of molecules along an approximate z-axis with respect the molecule shown. Additionally, directly above and below the plane of molecules can be other planes of molecules that are oriented along a y-axis with respect to the plane of molecules described previously. The term “plane” is not intended to infer that these molecules are perfectly aligned in rigid planar structures, but that the plurality of molecules is generally organized in a monolayer between the electrode layers. Thus, many other similar molecules, other than the molecule shown, are also positioned three-dimensionally between the electrode layers to form the monolayer. Thus, due to the relationship of the closely positioned molecular switches, the acceptor and donor groups of neighboring molecular switches can affect the stable orientation of each rotor.

The electric potential can vary in field strength depending on the specific molecular switch and the number of monolayers included. Typically, the electric potential can be from about 1 $\mu$V to about 1000 $\mu$V per molecular switch. The electric potential does not need to be maintained once the molecular switch has switched from one state to the other. Most often, the molecular switches of the present invention can be switched relatively quickly. In some embodiments of the present invention, the electric potential can be applied for about 1 $\mu$sec to about 10 msec. Note that each state is stable, thus the electric field does not need to be maintained in order to preserve either the first or second state once the switch has been placed in the first or second position. Further, the electric field can be applied along the molecular axis or at any other functional direction. Thus, in some embodiments, the electric field used to rotate the rotor can be independent of the electric field across the molecular switch. For example, the electric field can be applied in any direction such that rotation of the rotor occurs sufficient to switch the molecular switch from the first state to the second state or from the second state to the first state.

As discussed above, the first state can be highly conjugated, which allows for free movement of electrons across substantially the entire molecular switch. Conversely, the second state can be less conjugated wherein conjugation and $\pi$-bonding electrons are segregated to portions of the molecule. In Formula V, the conjugation is segregated to at least three portions, i.e. the two phenyl stators and the phenyl rotor. Thus, electron movement across the molecular switch in the second state is significantly limited or substantially eliminated altogether. Specifically, in some embodiments of the present invention, the first state can have a first resistivity ($R_1$), and the second state can have a second resistivity ($R_2$). The ratio of $R_2/R_1$ illustrates the difference in resistivity between the two states and can be one measure of the ability of a molecular switch to act as useful electronic components. In one aspect, the ratio of $R_2 \mu l$ can be from about 10 to about 100, and in another aspect can be from about 2 to about $10^4$.

The molecular switches described herein can be assembled to form any number of electronic components such as cross-bar and other circuits. Cross-bar circuits can be formed to perform memory, logic, communication, and other functions. These types of devices are known in the art and a more detailed description of particularly suitable devices can be found in U.S. Pat. No. 6,128,214, which is incorporated by reference herein, and in the above incorporated priority documents.

The following examples illustrate exemplary embodiments of the invention. However, it is to be understood that the following is only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following example provides further detail in connection with what is presently deemed to be a practical embodiment of the invention.

EXAMPLES

Example 1

Rotor Synthesis

Nitration of readily available 2,5-dibromotoluene (1) was performed by mixing excess nitric acid and sulfuric acid at about 0° C. for 30 minutes, as shown below.

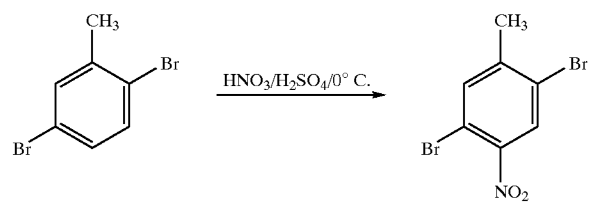

1

2

The product 2,5-dibromo-4-nitrotoluene (2) was achieved with a 60% yield as a pale yellow solid. The nitro substituent provides a strong electron-withdrawing group, i.e. the acceptor group, while methyl acts as a donor group. Compound 2 was then used as a reactant for attachment of the rotor portion of a molecular switch.

Example 2

Molecular Switch Synthesis

Referring now to the following reaction, a molecular switch was produced in accordance with the present invention.

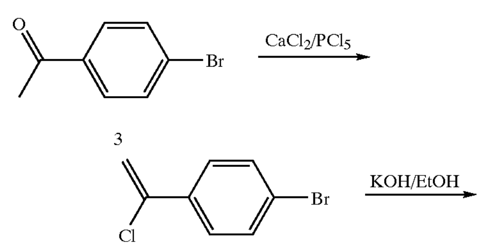

3

4

-continued

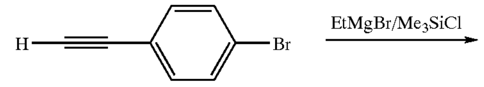

5

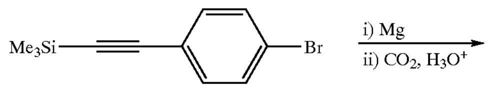

6

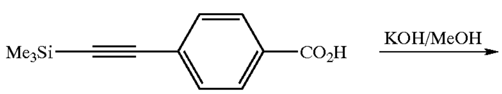

7

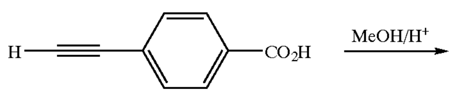

8

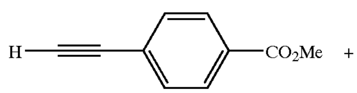

9

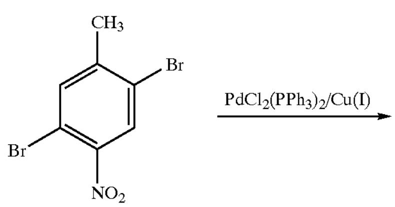

2

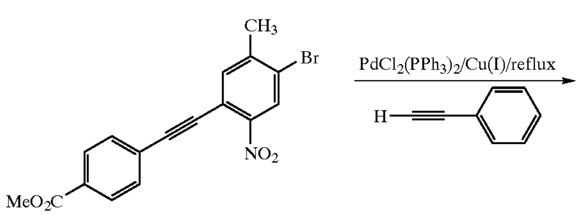

10

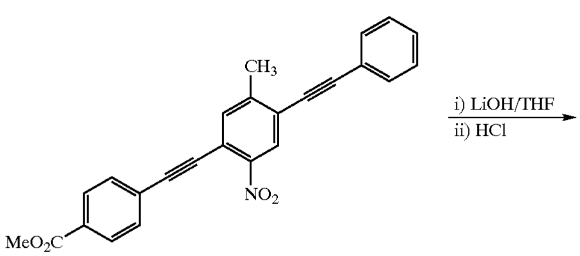

11

-continued

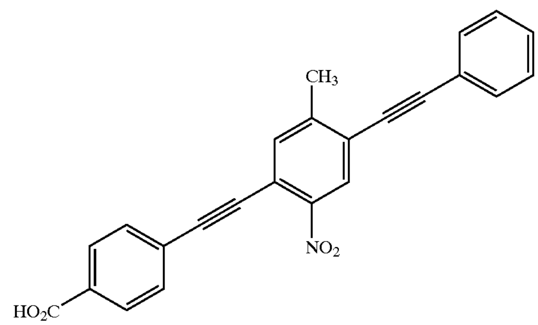

12

Initially, 4-bromoacetophenone (3) can be treated with powdered phosphorous pentachloride to produce 1-(4-bromophenyl)-1-chloroethylene (4). Compound 4 was then treated with potassium hydroxide to produce 4-bromophenylacetylene (5) at a 60% yield. Treatment of compound 5 with ethyl magnesium bromide was followed by reaction with chlorotrimethylsilane. The resulting product (4-bromophenylethynyl) trimethylsilane (6) was recovered with a 90% yield. Compound 6 was then treated with ethyl magnesium bromide, followed by reaction with carbon dioxide to produce (4-carboxyphenylethynyl) trimethylsilane (7) in 89% yield. Compound 7 was then deprotected using KOH in methanol to form 4-ethynylbenzoic acid (8) in 96% yield. Compound 8 is a useful building block for forming a variety of molecular switches in accordance with the present invention, and was used in forming molecular switches of the following examples.

Esterification of compound 8 produced the corresponding ester (9). Compound 9 was then coupled with rotor 2 produced in Example 1 by reaction with a palladium copper catalyst at room temperature to produce compound 10. Compound 10 was then coupled with phenyl acetylene by reaction with the palladium catalyst under reflux to produce compound 11. Compound 11 was hydrolyzed with LiOH followed by treatment with hydrochloric acid to form molecular switch 12. Molecular switch 12 was recovered as a brown solid. In this example molecular switch 12 has a phenyl group as the hydrophobic moiety and a carboxy group as the hydrophilic moiety.

Example 3

Molecular Switch Synthesis

The following reaction sequence was used to form a molecular switch having long chain hydrocarbons at the hydrophobic end of the molecule.

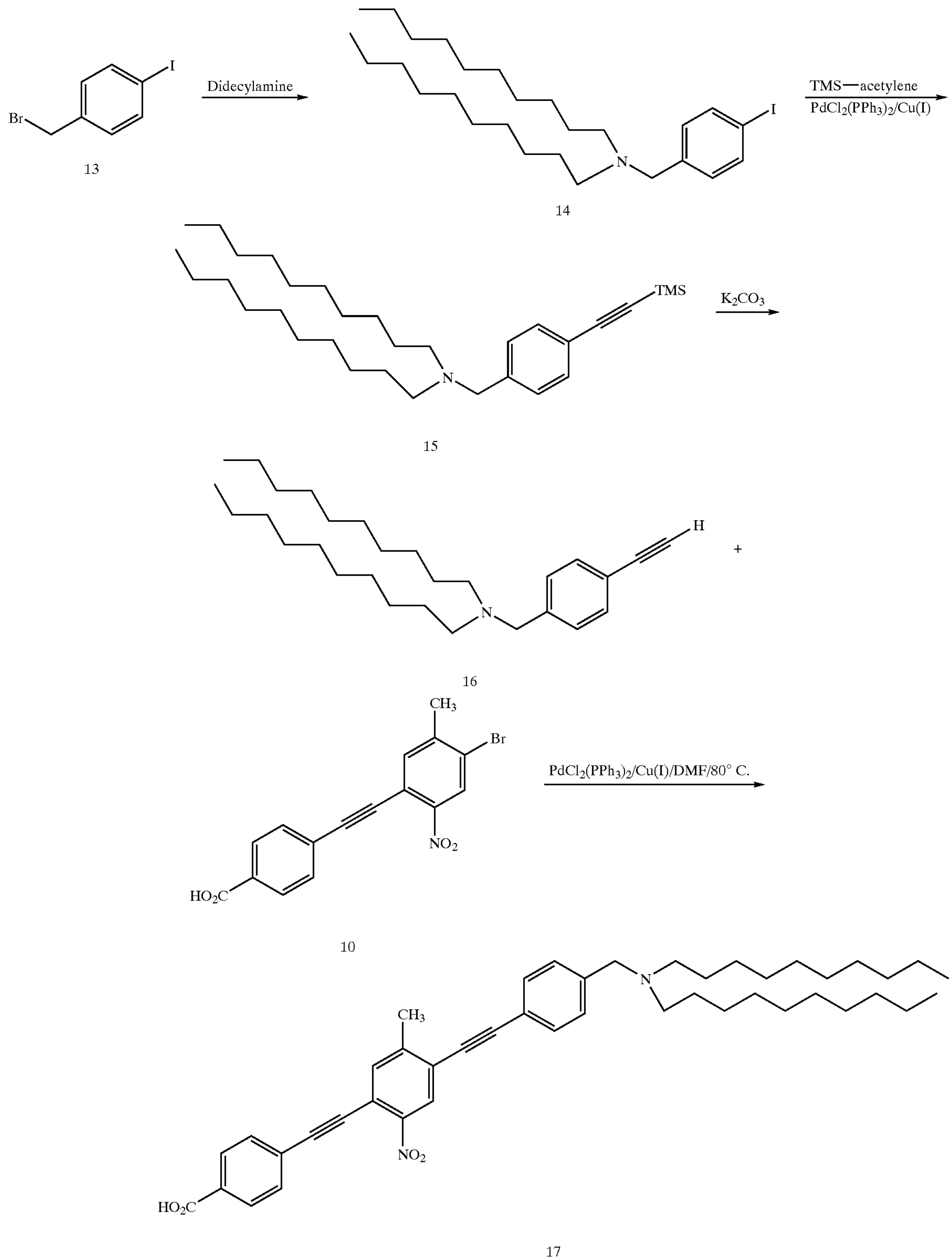

Commercially available 4-iodobenzyl bromide (13) was reacted with didecylamine to produce 4-didecylaminomethyl)-1-iodobenzene (14) in 92% yield. Compound 14 wa then coupled with trimethylsilyl acetylene in the presence of dichlorobis(triphenylphosphine)palladium, as a catalyst, to form 4-(didecylaminomethyl)-1-(trimethylsilylethynyl) benzene (15) in nearly quantitative yield. Compound 15 was then deprotected by treatment with potassium carbonate and methanol to form compound 16 in 88% yield. Compound 16 was then coupled with intermediate compound 10 (from Example 2) in the presence of $PdCl_2(PPh_3)_2$ and Cu(I) to form molecular switch 17 in 42% yield. Molecular switch 17 has didecylaminomethyl as the hydrophobic moiety and carboxy as the hydrophilic moiety. Preliminary results indicate that compound 17 is water soluble which makes molecular switch 17 a suitable candidate for monolayer formation using SAM methods.

Example 4

Molecular Switch Synthesis

The following reaction sequence was followed to produce another molecular switch in accordance with the principles of the present invention.

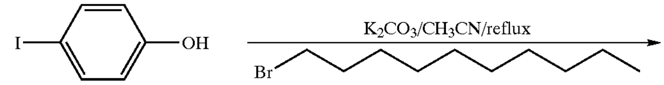

18

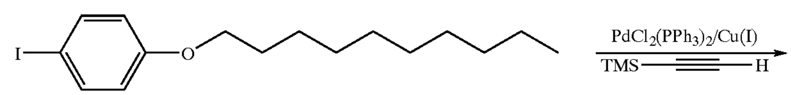

19

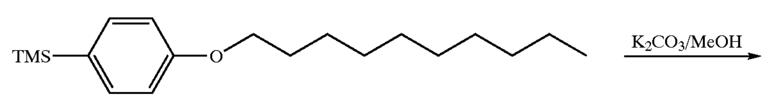

20

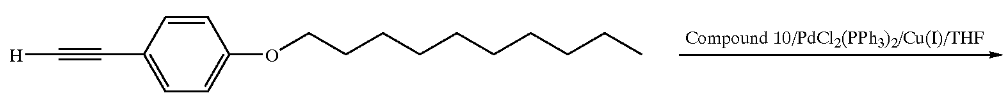

21

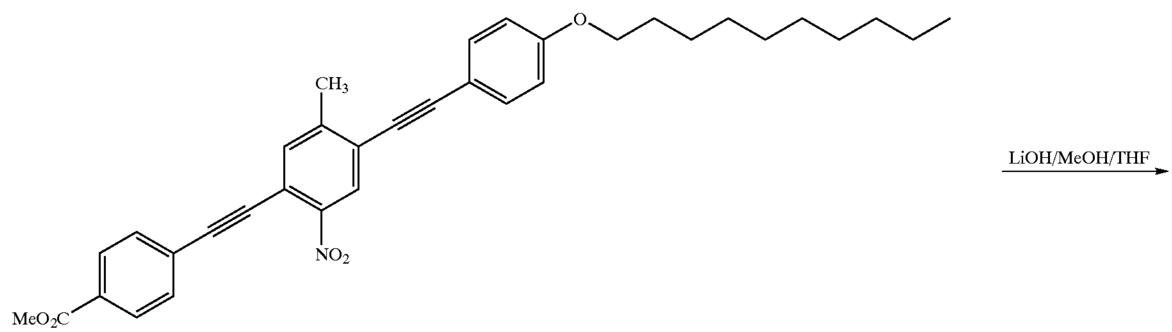

22

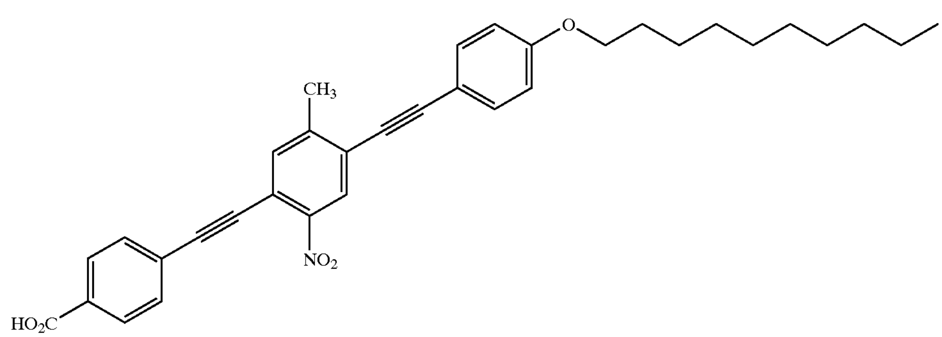

23

Reaction of 4-iodophenol (18) and bromoundecane produced compound 19 in 86% yield. Compound 19 was then coupled with TMS-protected acetylene to form acetylene compound 20 which was then deprotected using potassium carbonate in methanol to produce acetylene compound 21. The acetylene compound 21 was then cross-coupled with intermediate compound 10 (from Example 2) with a palladium catalyst in tetrahydrofuran at room temperature to form compound 22 in 28% yield. Hydrolysis of compound 22 was then accomplished using lithium hydroxide in methanol and tetrahydrofuran to produce molecular switch 23 in 60% yield.

Example 5

Molecular Switch Synthesis

The reaction sequence shown below was used to produce a molecular switch having a decyl group as the hydrophobic moiety and a carboxy group as the hydrophilic moiety.

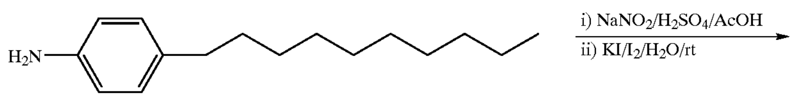

24

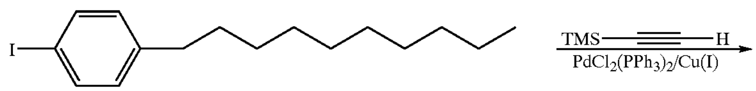

25

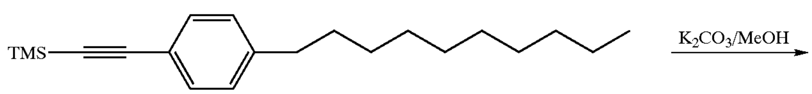

26

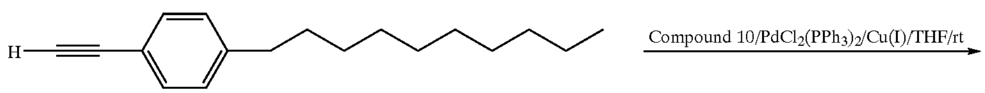

27

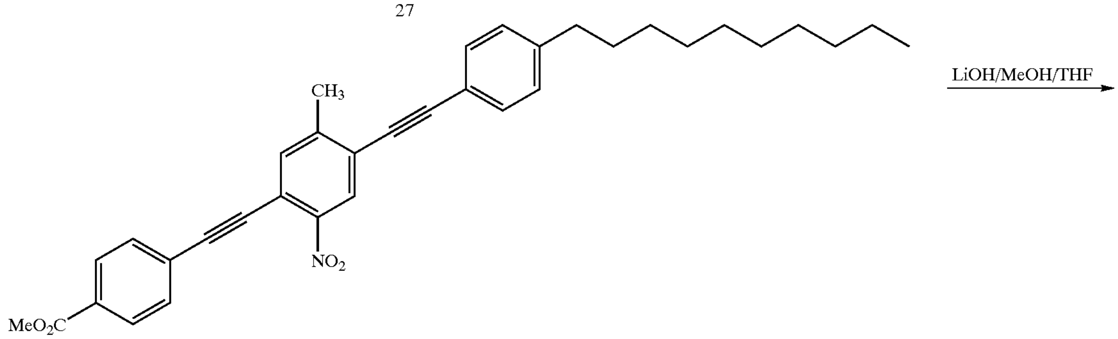

28

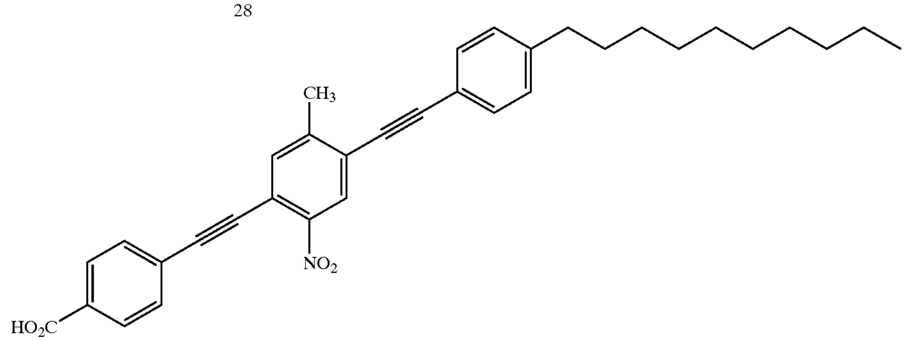

29

Diazotization of 4-n-decylaniline (24) was accomplished with sodium nitrate in an acid solution. Diazotization was followed by reaction with iodine and potassium iodide at room temperature to form iodo-compound 25 in 70% yield. Compound 25 was then coupled with TMS-protected acetylene over a palladium catalyst to form acetylene compound 26. Acetylene compound 26 was then deprotected using potassium carbonate in methanol to produce acetylene compound 27 in 83% yield. Compound 27 was subsequently coupled with intermediate compound 10 (again from Example 2) in the presence of a palladium catalyst and tetrahydrofuran at room temperature to produce compound 28 in 30% yield. One reason for low yield at this step can be the self-coupling of acetylene compound 27. Compound 28 was then hydrolyzed using lithium hydroxide in methanol and tetrahydrofuran to form molecular switch 29 in 75% yield. Molecular switch 29 includes a decyl group as the hydrophobic moiety and a carboxy group as the hydrophilic moiety which is stable and well suited to monolayer formation using L-B methods.

It is to be understood that the above-referenced arrangements are illustrative of the application for the principles of the present invention. Thus, while the present invention has been described above in connection with the exemplary embodiments of the invention, it will be apparent to those of ordinary skill in the art that numerous modifications and alternative arrangements can be made without departing from the principles and concepts of the invention as set forth in the claims.

What is claimed is:

1. A bistable molecular switch having a highly conjugated first state and a less conjugated second state such that application of an electric field reversibly switches the molecular switch from the first state to the second state, said molecular switch comprising a hydrophobic moiety and a hydrophilic moiety.

2. The molecular switch of claim 1, further comprising at least one rotor having a donor group and an acceptor group, each of the donor and the acceptor groups being operably connected to the rotor to cause switching upon application of an electric field, said donor group having a lower electronegativity than the acceptor group.

3. The molecular switch of claim 2, wherein said molecular switch has the general molecular structure $$X_1—Y_1—Z_1—\underset{\displaystyle A}{\overset{\displaystyle D}{R}}—Z_2—Y_2—X_2$$

where a is the acceptor group, D is the donor group, R is the rotor, $X_1$ is the hydrophilic moiety, $X_2$ is the hydrophobic moiety, $Y_1$ is a first stator, $Y_2$ is a second stator, $Z_1$ is a first bridging group, and $Z_2$ is a second bridging group.

4. The molecular switch of claim 3, wherein the hydrophobic moiety comprises a long substituted or unsubstituted hydrophobic chain having from 6 to about 30 carbons.

5. The molecular switch of claim 4, wherein the hydrophobic moiety comprises a long substituted or unsubstituted hydrophobic chain having from 8 to about 20 carbons.

6. The molecular switch of claim 4, wherein the hydrophobic moiety comprises a member selected from the group consisting of alkyl, alkoxy, alkyl thio, alkyl amino, alkyl seleno, aryl, aryloxy, aryl thio, aryl amino, aryl seleno, and combinations thereof.

7. The molecular switch of claim 6, wherein the hydrophobic moiety is an unsubstituted alkyl.

8. The molecular switch of claim 3, wherein the hydrophilic moiety is selected from the group consisting of carboxylic acid, sulfuric acid, alcohol, ethyl, polyether, tetrahydrofuran, pyridine, imidazole, pyrrole, furan, thiophene, and combinations thereof.

9. The molecular switch of claim 3, wherein the donor group is selected from the group consisting of a hydrocarbon having from one to six carbon atoms, hydrogen, amine, hydroxy, thiol, ether, and combinations thereof.

10. The molecular switch of claim 9, wherein the acceptor group is selected from the group consisting of nitro, nitrile, ketone, imine, acids, trifluoromethyl, trichloromethyl, hydrocarbons having from one to six carbon atoms, and combinations thereof, and wherein said donor group has a lower electronegativity than the acceptor group.

11. The molecular switch of claim 3, wherein the first and second bridging groups are independently selected from the group consisting of acetylene, ethylene, amide, imide, imine, azo, and combinations thereof.

12. The molecular switch of claim 11, wherein the first and second bridging groups are each acetylene.

13. The molecular switch of claim 3, wherein the first and second stators are independently selected from the group benzene or substituted benzene, naphthalene, acenaphthalene, anthracene, phenanthrene, benzanthracene, dibenzanthracene, fluorene, benzofluorene, fluoranthene, pyrene, benzopyrene, naphthopyrene, chrysene, perylene, benzoperylene, pentacene, coronene, tetraphenylene, triphenylene, decacyclene, pyrrole, thiophene, porphine, pyrazole, imidazole, triazole, isoxazole, oxadiazole, thiazole, isothiazole, thiadiazole, pyridazine, pyrimidine, uracil, azauracil, pyrazine, triazine, pyridine, indole, carbazole, benzofuran, dibenzofuran, thianaphthene, dibenzothiophene, indazole, azaindole, iminostilbene, norharman, benzimidazole, benzotriazole, benzisoxazole, anthranil, benzoxazole, benzothiazole, triazolopyrimidine, triazolopyridine, benzselenazole, purine, quinoline, benzoquinoline, acridine, iso quinoline, benzacridine, phenathridine, phenanthroline, phenazine, quinoxaline, and combinations thereof.

14. The molecular switch of claim 13, wherein the first and second stators are each phenyl.

15. The molecular switch of claim 3, wherein the rotor comprises a member selected from the group consisting of benzene or substituted benzene, naphthalene, acenaphthalene, anthracene, phenanthrene, benzanthracene, dibenzanthracene, fluorene, benzofluorene, fluoranthene, pyrene, benzopyrene, naphthopyrene, chrysene, perylene, benzoperylene, pentacene, coronene, tetraphenylene, triphenylene, decacyclene, pyrrole, thiophene, porphine, pyrazole, imidazole, triazole, isoxazole, oxadiazole, thiazole, isothiazole, thiadiazole, pyridazine, pyrimidine, uracil, azauracil, pyrazine, triazine, pyridine, indole, carbazole, benzofuran, dibenzofuran, thianaphthene, dibenzothiophene, indazole, azaindole, iminostilbene, norharman, benzimidazole, benzotriazole, benzisoxazole, anthranil, benzoxazole, benzothiazole, triazolopyrimidine, triazolopyridine, benzselenazole, purine, quinoline, benzoquinoline, acridine, iso quinoline, benzacridine, phenathridine, phenanthroline, phenazine, quinoxaline, and combinations thereof.

16. The molecular switch of claim 15, wherein the rotor comprises a phenyl.

17. The molecular switch of claim 3, having the chemical structure

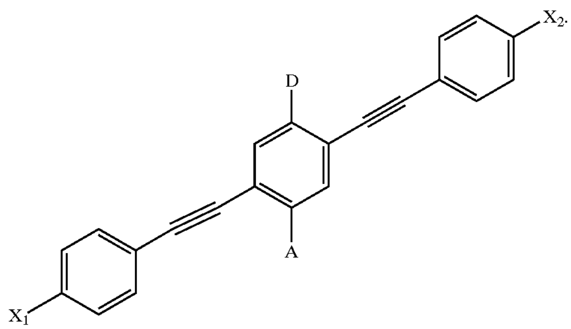

18. The molecular switch of claim 3, having the chemical structure

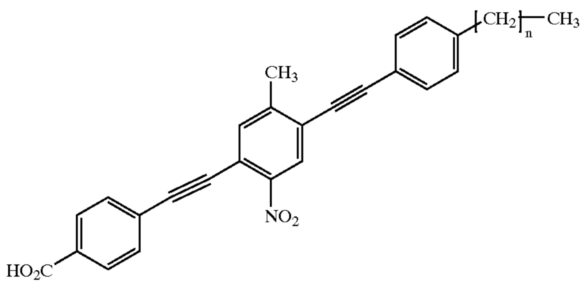

where n is an integer from 5 to about 19.

19. A molecular switch system, comprising:

a) a substrate; and b) a plurality of bistable molecular switches on the substrate, said molecular switches having a highly conjugated first state and a less conjugated second state such that application of an electric field reversibly switches the molecular switch from the first state to the second state, and wherein said molecular switch has a hydrophobic moiety and a hydrophilic moiety such that substantially all of the molecular switches have the hydrophilic moiety oriented in the same direction.

20. The system of claim 19, wherein said molecular switches each further comprise at least one rotor having a donor group and an acceptor group each operably connected to the rotor to cause switching upon application of an electric field, said donor group having a lower electronegativity than the acceptor group and wherein said molecular switch has the general molecular structure

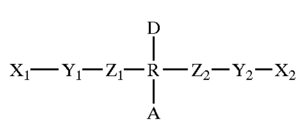

where A is the acceptor group, D is the donor group, R is the rotor, $X_1$ is the hydrophilic moiety, $X_2$ is the hydrophobic moiety, $Y_1$ is a first stator, $Y_2$ is a second stator, $Z_1$ is a first bridging group, and $Z_2$ is a second bridging group.

21. The system of claim 20, wherein said molecular switches have the chemical structure

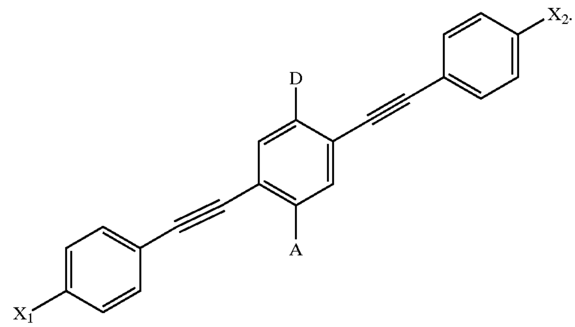

22. The system of claim 19, wherein the substrate is a conductive electrode layer.

23. The system of claim 22, wherein the conductive electrode layer comprises a material selected from the group consisting of silver, gold, copper, and alloys thereof.

24. The system of claim 22, further comprising a second conductive electrode layer such that the plurality of molecular switches is between the conductive electrode layer and second conductive electrode layer.

25. The system of claim 19, wherein the substrate has a thickness of from 1 nm to about 1.5 $\mu$m.

26. The system of claim 19, wherein the plurality of molecular switches has a thickness of from about 1 nm to about 100 nm and cover an area of the substrate of from about 0.01 $\mu m^2$ to about 0.01 $mm^2$.

27. The system of claim 19, wherein the plurality of molecular switches is configured in a single monolayer.

28. A method of storing data, comprising the steps of:

a) forming a molecular switch system including a layer of molecular switches between a first electrode layer and a second electrode layer, said molecular switches having a highly conjugated first state and a less conjugated second state such that application of an electric field reversibly switches the molecular switch from the first state to the second state, and wherein said molecular switch has a hydrophobic moiety and a hydrophilic moiety such that substantially all of the molecular switches have the hydrophilic moiety oriented in the same direction toward the first electrode layer; and b) inducing an electric potential between the first and second electrode layers sufficient to switch the molecular switches from the first or second state to the second or first state, respectively.

29. The method of claim 28, wherein said molecular switches each further comprise at least one rotor having a donor group and an acceptor group each operably connected to the rotor to cause switching upon application of an electric field, said donor group having a lower electronegativity than the acceptor group and wherein said molecular switch has the general molecular structure

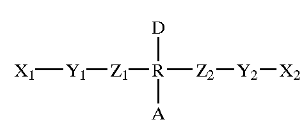

where A is the acceptor group, D is the donor group, R is the rotor, $X_1$ is the hydrophilic moiety, $X_2$ is the hydrophobic moiety, $Y_1$ is a first stator, $Y_2$ is a second stator, $Z_1$ is a first bridging group, and $Z_2$ is a second bridging group.

30. The method of claim 28, wherein the first and second electrode layers comprise a material independently selected from the group consisting of silver, gold, copper, platinum, alumina, silicon, ITO, and alloys thereof.

31. The method of claim 28, wherein the step of inducing an electric potential occurs during a time frame of from about 1 $\mu$sec to about 10 msec.

32. The method of claim 28, wherein the electric potential is from about 1 $\mu$V to about 1000 $\mu$V per molecular switch.

33. The method of claim 28, wherein the step of forming includes using a Langmuir-Blodgett thin film technique to form at least one monolayer and orient the molecular switches.

34. The method of claim 28, wherein the molecular switch system has a thickness of from about 1 nm to about 1.5 $\mu$m.

35. The method of claim 28, wherein the first state has a first resistivity, $R_1$ and the second state has a second resistivity, $R_2$, such that $R_2/R_1$ is from about 2 to about $10^4$.

36. The method of claim 28, wherein the layer of molecular switches is a single monolayer.

* * * * *

UNITED STATES PATENT AND TRADEMARK OFFICE

CERTIFICATE OF CORRECTION

PATENT NO. : 6,995,312 B2
APPLICATION NO. : 10/786986
DATED : February 7, 2006
INVENTOR(S) : Zhou et al.

It is certified that error appears in the above-identified patent and that said Letters Patent is hereby corrected as shown below:

In the Claims

Col. 21 (line 53), delete “a” and insert therefor --A--.

Signed and Sealed this

Twenty-sixth Day of December, 2006

JON W. DUDAS

*Director of the United States Patent and Trademark Office*